(12) United States Patent
Sudo et al.

(10) Patent No.: US 7,564,746 B2
(45) Date of Patent: Jul. 21, 2009

(54) OPTICAL DISK APPARATUS

(75) Inventors: Kazuya Sudo, Daito (JP); Joji Yoshioka, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 574 days.

(21) Appl. No.: 11/406,280

(22) Filed: Apr. 19, 2006

(65) Prior Publication Data

US 2006/0250901 A1 Nov. 9, 2006

(30) Foreign Application Priority Data

Apr. 19, 2005 (JP) ............................. 2005-121639

(51) Int. Cl.
G11B 7/00 (2006.01)
(52) U.S. Cl. ................................. 369/44.14
(58) Field of Classification Search ... 369/44.14–44.16, 369/44.22; 720/681, 685; 359/814, 824
See application file for complete search history.

(56) References Cited

U.S. PATENT DOCUMENTS

| 5,010,246 | A | * | 4/1991 | Tsuyuguchi et al. | ......... | 250/216 |
| 5,073,883 | A | * | 12/1991 | Mitsumori | ............... | 369/44.15 |
| 5,917,795 | A | * | 6/1999 | Furukawa et al. | ........... | 720/635 |
| 6,633,519 | B2 | * | 10/2003 | Park et al. | ................ | 369/44.14 |
| 6,807,670 | B2 | * | 10/2004 | Ohtsuka | ...................... | 720/672 |
| 2003/0210641 | A1 | * | 11/2003 | Shinozuka | ................... | 369/244 |
| 2004/0223447 | A1 | | 11/2004 | Tanaka et al. | | |
| 2005/0018553 | A1 | * | 1/2005 | Kang et al. | .............. | 369/44.15 |

FOREIGN PATENT DOCUMENTS

| CN | 1551155 A | 12/2004 |
| JP | 09-051179 | 2/1997 |
| JP | 09-275285 | 10/1997 |
| JP | 2002-072041 | 3/2002 |

* cited by examiner

Primary Examiner—Thang V Tran
(74) Attorney, Agent, or Firm—Pillsbury Winthrop Shaw Pittman

(57) ABSTRACT

An optical disc apparatus includes a pickup assembly, a first printed circuit board, a second printed circuit board, and a flexible printed circuit board. The pickup assembly is adapted to focus a laser beam through an objective lens onto an optical disc in order to retrieve data stored on the optical disc. The first printed circuit board is mounted on the pickup assembly and adapted to control an actuator for activating the objective lens. The second printed circuit board is mounted on the pickup assembly and adapted to instruct the first printed circuit board to activate the objective lens. The flexible printed circuit board is connected to each of the first and second printed circuit boards in order to establish electrical connection therebetween. The flexible printed circuit board is mounted in such a manner as to be twisted approximately in middle thereof.

3 Claims, 4 Drawing Sheets

OPTICAL DISK APPARATUS

CROSS REFERENCE

This Nonprovisional application claims priority under 35 U.S.C. §119(a) on Patent Application No. 2005-121639 filed in Japan on Apr. 19, 2005, the entire contents of which are hereby incorporated by reference.

BACKGROUND OF THE INVENTION

The invention relates to optical disc apparatus adapted to retrieve data stored on optical discs such as compact discs (CDs) or digital versatile discs (DVDs).

Such optical disc apparatus, having been widely used, include a pickup assembly. The assembly is adapted to focus a laser beam through an objective lens onto an optical disc placed in the apparatus, to detect light reflected by the optical disc, and to output a read signal according to the detected light. The assembly is mounted so as to be movable along a radial direction of an optical disc placed in the apparatus. The assembly is provided with an actuator for activating the objective lens. On the assembly mounted are an actuator printed circuit board (hereinafter referred to as the actuator board) and a controller printed circuit board (hereinafter referred to as the controller board). The actuator board is adapted to control the actuator. The controller board is adapted to instruct the actuator board to activate the objective lens. A flexible printed circuit board (hereinafter referred to as FPC) is connected to each of the actuator board and the controller board in order to establish electrical connection therebetween. Referring to FIG. 1, an FPC is mounted with sufficient looseness to prevent wire breakage or disconnection from being caused in connections between the FPC and each of the actuator and controller boards by the movement of the assembly. If mounted with insufficient looseness, in other words, the FPC causes a high incidence of such wire breakage or disconnection.

In the meanwhile, the FPC as loosely mounted is likely to interfere with other components. This is more the case with an apparatus in which an FPC is used to connect two circuit boards whose relative positions vary depending on operation modes, because the variations in relative position cause the FPC to have varying degrees of looseness. Many approaches have been proposed to prevent interference of an FPC with other components. Typical examples of these approaches are disclosed in JP H09-051179A, JP 2002-072041A, and JP H09-275285A.

All of these conventional approaches have been to prevent interference of an FPC with other components by providing an apparatus with an additional device for adjusting looseness in the FPC. Thus, the conventional approaches involve an increase in manufacturing costs and dimensions of the apparatus.

In view of the foregoing, a feature of the invention is to provide an optical disc apparatus adapted to prevent wire breakage or disconnection in two printed circuit boards connected by an FPC without increasing manufacturing costs and dimensions of the apparatus.

SUMMARY OF THE INVENTION

An optical disc apparatus according to an aspect of the invention includes a pickup assembly adapted to focus a laser beam through an objective lens onto an optical disc placed in the apparatus and detect light reflected by the optical disc, thereby retrieving data stored on the optical disc. The apparatus also includes an actuator printed circuit board, a controller printed circuit board, and an FPC. The actuator and controller printed circuit boards are mounted on the pickup assembly. The FPC is connected to each of the actuator and controller printed circuit boards in order to establish electrical connection between the actuator and controller printed circuit boards. The FPC is mounted in such a manner as to be twisted approximately in middle thereof. The actuator printed circuit board is adapted to control an actuator for activating the objective lens. The controller printed circuit board is adapted to instruct the first printed circuit board to activate the objective lens.

The FPC has looseness in the twisted portion. The looseness reduces pull load applied on connections between the FPC and each of the actuator and controller printed circuit boards by movement of the pickup assembly along a radial direction of the optical disc. This configuration prevents disconnection between the actuator and controller printed circuit boards, thereby improving reliability of the apparatus. This configuration is realized by the mere twisting of the FPC and thus does not cause an increase in manufacturing costs and dimensions of the apparatus.

According to another aspect of the invention, the FPC is twisted at various angles according to angles between respective lines along which respective connecting terminals for connecting the actuator and controller printed circuit boards to the FPC are arranged.

According to another aspect of the invention, the FPC has an indentation where the FPC is to be twisted. The indentation facilitates twisting of the FPC.

According to another aspect of the invention, the pickup assembly has a positioning member located in proximity to the connecting terminals of the actuator printed circuit board, and the FPC has a recess of such shape that the positioning member engages therewith. This configuration facilitates establishment of electrical connection between the actuator printed circuit board and the FPC. Alternatively, the pickup assembly has a positioning member located in proximity to the connecting terminals of the controller printed circuit board, and the FPC has a recess of such shape that the positioning member engages therewith. This configuration facilitates establishment of electrical connection between the controller printed circuit board and the FPC.

DETAILED DESCRIPTION OF THE INVENTION

Referring to the accompanying drawings, optical disc apparatus according to embodiments of the invention will be described below.

Figure 1:
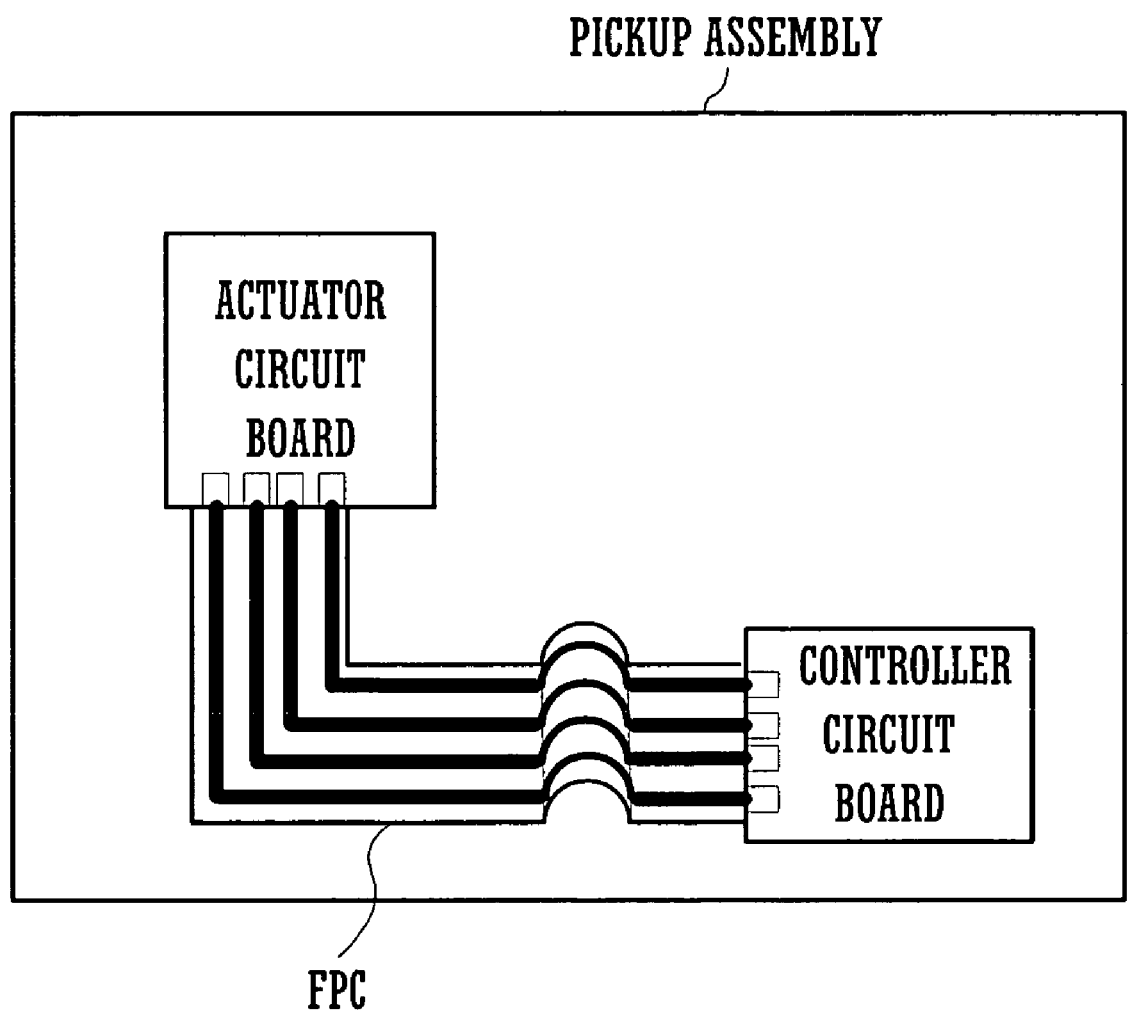
FIG. 1 is a schematic diagram illustrating configuration of a pickup assembly provided in a conventional optical disc apparatus.
Figure 2:
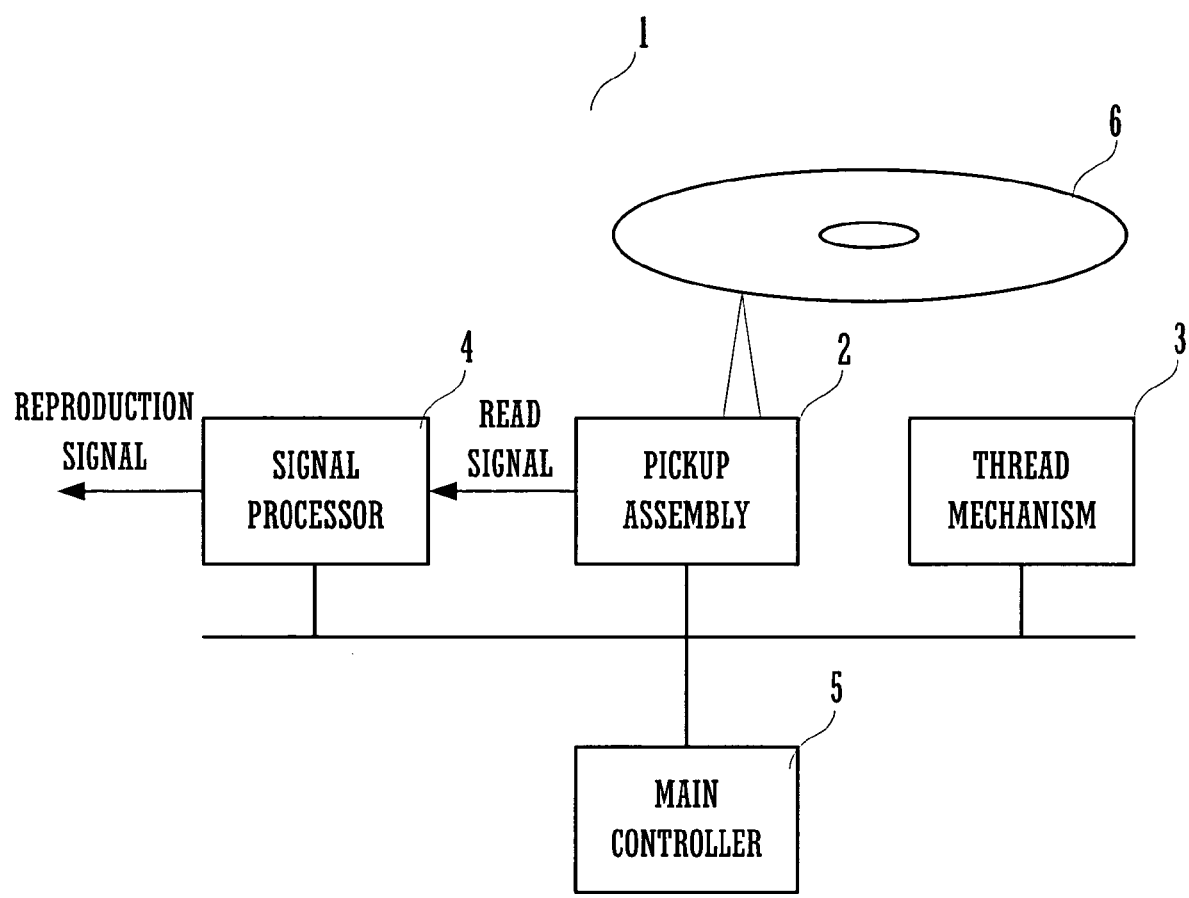
FIG. 2 is a block diagram illustrating configuration of relevant parts of an optical disc apparatus according to an embodiment of the invention.

FIG. 2 is a block diagram illustrating configuration of relevant parts of an optical disc apparatus 1 according to an embodiment of the invention. The apparatus 1 includes a pickup assembly 2. The assembly 2 focuses a laser beam onto an optical disc 6, such as a CD or DVD, and detects light reflected by the disc 6. The assembly 2 outputs a signal according to the reflected light as detected, as a read signal representing data stored on the disc 6. The assembly 2 is mounted so as to be movable along a radial direction of the disc 6. A thread mechanism 3 moves the assembly 2 along the radial direction, thereby controlling which part of the disc 6 data is to be retrieved from. A data acquisition device such as a signal processor 4 processes the read signal received from the assembly 2 in order to obtain data stored on the disc 6. The processor 4 outputs a reproduction signal according to the obtained data. A main controller 5 has overall control over the assembly 2, the mechanism 3, and the processor 4.

Figure 3A:
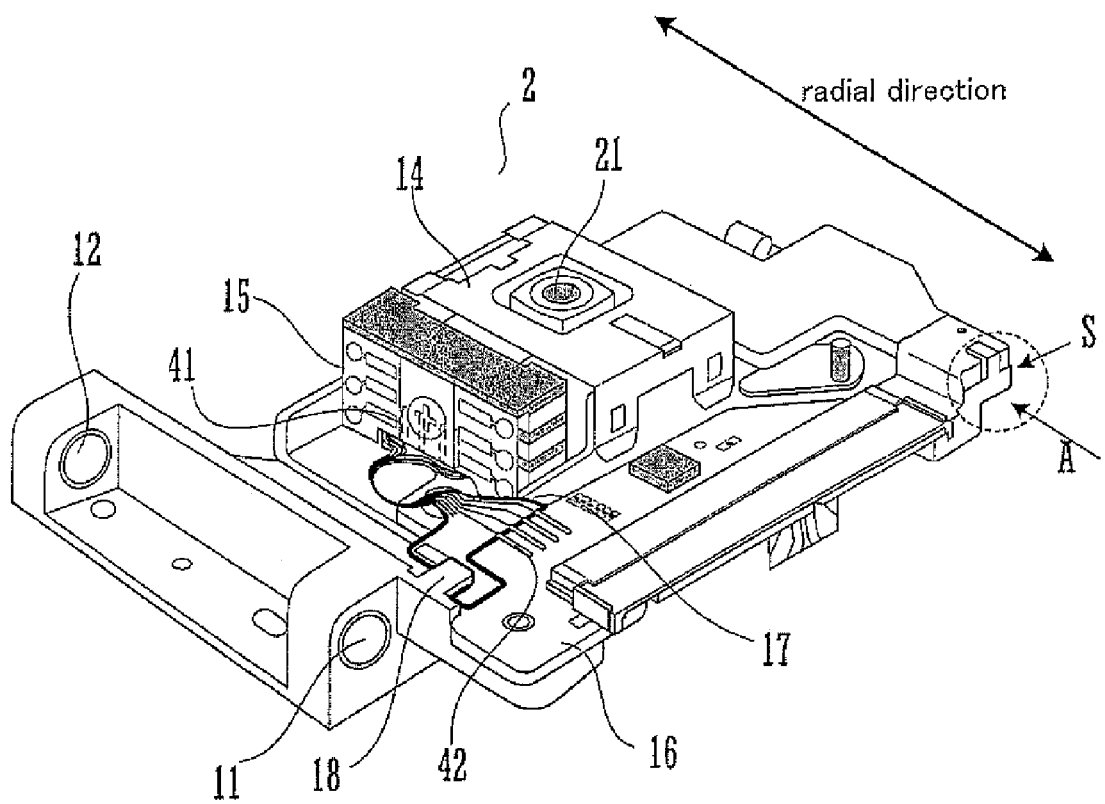
FIGS. 3A and 3B are views illustrating a pickup assembly provided in the optical disc apparatus.
Figure 3B:
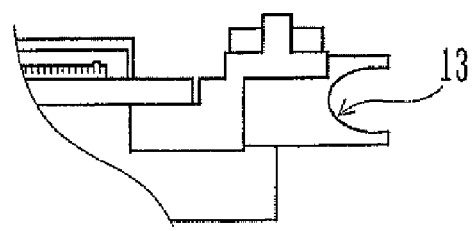

FIG. 3A is a view illustrating the pickup assembly 2. FIG. 3B is a vertical cross-sectional view from a direction A of a portion S as shown in FIG. 3A. The assembly 2 is mounted to the apparatus 1 with two shafts: a first one of the two shafts is inserted through holes 11 and 12 as shown on the lower left side of FIG. 3A; and a second one is fitted in a support 13 of semicircular shape as shown in FIG. 3B. Thus, the thread mechanism 3 moves the assembly 2 along the two shafts along the radial direction of the disc 6.

The assembly 2 has a pickup module 14 mounted thereon. The module 14 is adapted to focus a laser beam onto the disc 6 and to detect light reflected by the disc 6. The module 14 has a laser diode (LD), an objective lens 21, a photodiode (PD), and an actuator. The LD serves as a light source to emit a laser beam toward the disc 6. The lens 21 is used to focus the laser beam onto a recorded surface of the disc 6. The PD is used to detect light reflected by the disc 6. The actuator is adapted to activate the lens 21.

The assembly 2 also has a first printed circuit board such as an actuator printed circuit board 15, and a second printed circuit board such as a controller printed circuit board 16, mounted thereon. The board 15 is adapted to control the actuator. The board 16 is adapted to instruct the board 15 to activate the lens 21. A flexible printed circuit board (FPC) 17 is connected to each of the boards 15 and 16 in order to establish electrical connection between the boards 15 and 16.

Figure 4A:
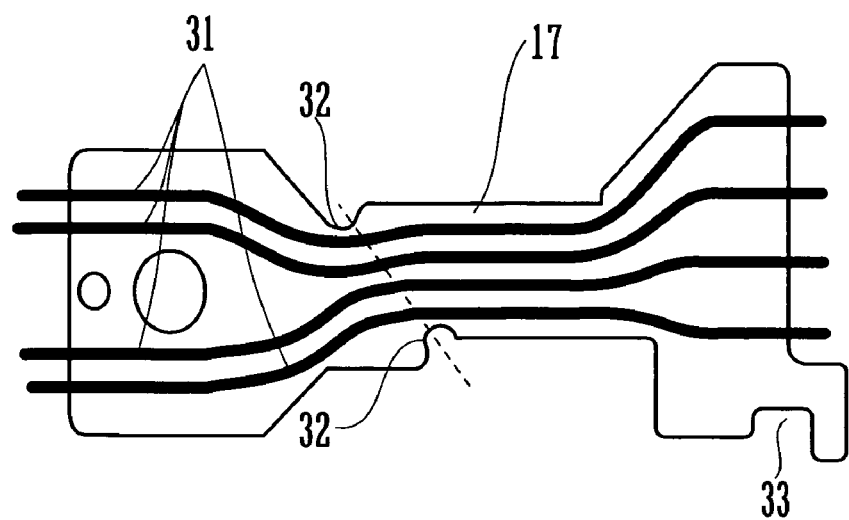
FIGS. 4A and 4B are views illustrating an FPC provided in the optical disc apparatus.
Figure 4B:
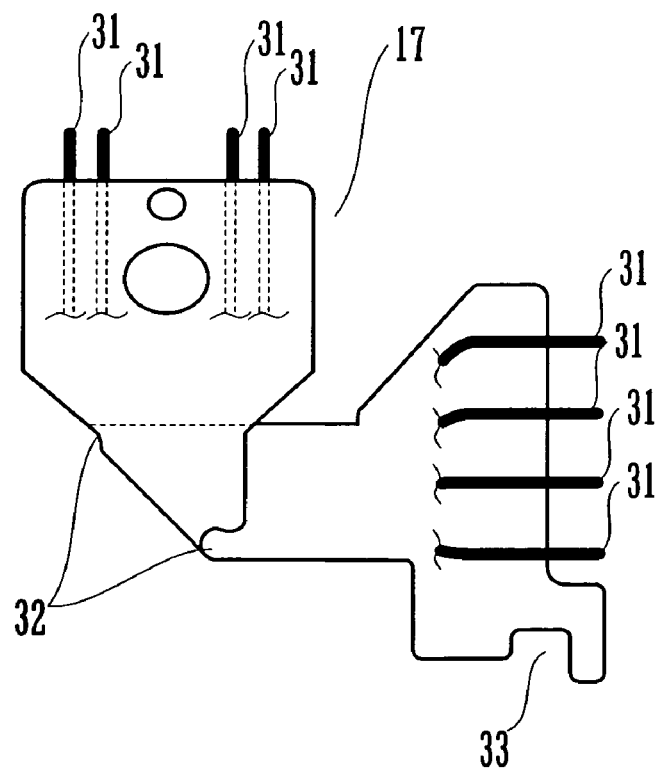

FIGS. 4A and 4B are views illustrating the FPC 17. Referring to FIG. 4A, the FPC 17 has a plurality of lines 31 leading from a left-hand end to a right-hand end thereof. At the left-hand end, the lines 31 are connected to connecting terminals 41 provided in the board 15. Referring back to FIG. 3A, the terminals 41 are located on a side of the board 15 facing the module 14. The terminals 41 are arranged along a moving direction of the assembly 2. At the right-hand end, the lines 31 are connected to connecting terminals 42 provided in the board 16. Referring back to FIG. 3A, the terminals 42 are located on an upper side of the assembly 2 and arranged along a perpendicular direction to the moving direction of the assembly 2. More specifically, the terminals 41 are arranged on a line perpendicular to that on which the terminals 42 are arranged. The FPC 17 is connected to the terminals 41 and 42 by soldering, for example.

In addition, the assembly 2 has a projection 18 formed in proximity to the terminals 42. The projection 18 is adapted to position the FPC 17 properly. The projection 18 may be formed on the board 16, instead of in a frame of the assembly 2 as shown in FIG. 3A. On the end connected to the terminals 42, the FPC 17 has a recess such as a pit 33 of such shape that the projection 18 engages therewith. With the projection 18 engaged with the pit 33, each of the lines 31 approximately overlaps a corresponding one of the terminals 42. When the FPC 17 is to be connected to the board 16, thus, the FPC 17 is properly positioned by engaging the projection 18 with the pit 33.

Referring to FIG. 4A, further, the FPC 17 has an indentation 32 approximately in middle of each longitudinal edge thereof. Referring to FIGS. 4A and 4B, the FPC 17 is twisted on a dashed line connecting the indentations 32, so that the FPC 17 has looseness in the twisted portion. The looseness prevents interference of the FPC 17 with other components. Also, the indentations 32 facilitate twisting of the FPC 17 when the FPC 17 is to be connected to each of the boards 15 and 16.

In addition, the board 16 is connected to the signal processor 4 and to the main controller 5.

The apparatus 1 performs a seek operation in a process as described below. It is known in the art that, in the seek operation, the thread mechanism 3 moves the assembly 2 along the radial direction of the disc 6. When in the seek operation the thread mechanism 3 starts or stops moving the assembly 2, inertial forces with different strengths act on components such as the boards 15 and 16 and the FPC 17, thereby causing the board 15 or 16 to pull the FPC 17. However, the looseness of the FPC 17 in the twisted portion reduces pull force that the board 15 or 16 exerts on the FPC 17, thereby lessening pull load applied on connections between the FPC 17 and each of the boards 15 and 16. This configuration prevents disconnection between the boards 15 and 16, and thus improves reliability of the apparatus 1. Further, this configuration is realized by the mere twisting of the FPC 17 and thus does not cause a problem such as of an increase in manufacturing costs and dimensions of the apparatus 1.

The apparatus 1 according to the foregoing embodiments does not have a function of recording data on the disc 6. However, it is to be noted that the invention is applicable to an optical disc apparatus with the data recording function.

Instead of the indentations 32 as described above, the FPC 17 may have an indentation only on one longitudinal edge thereof. Alternatively, the FPC 17 may dispense with an indentation.

Further alternatively, the projection 18 may be formed in proximity to the terminals 41, and the pit 33 of such shape that the projection 18 engages therewith may be formed on the end where the FPC 17 is connected to the terminals 41.

Further alternatively, the FPC 17 may be twisted twice or more times, instead of once in the foregoing embodiments.

Further alternatively, the FPC 17 may be twisted at various angles according to angles between the respective lines on which the terminals 41 and 42 are arranged.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical disc apparatus comprising:
   a pickup assembly adapted to focus a laser beam through an objective lens onto an optical disc placed in the apparatus, to detect light reflected by the optical disc, and to output a read signal according to the detected light;
   a thread mechanism adapted to move the pickup assembly along a radial direction of the optical disc;
   a data acquisition device adapted to process the read signal in order to obtain data stored on the optical disc;
   a first printed circuit board mounted on the pickup assembly, the first printed circuit board being adapted to control an actuator for activating the objective lens;
   a second printed circuit board mounted on the pickup assembly, the second printed circuit board being adapted to instruct the first printed circuit board to activate the objective lens; and a flexible printed circuit board connected to each of the first and second printed circuit boards in order to establish electrical connection between the first and second printed circuit boards, the flexible printed circuit board being mounted in such a manner as to be twisted approximately in middle thereof, wherein the first printed circuit board includes a first connecting terminal for connecting to the flexible printed circuit board from a perpendicular direction to the radial direction, and the second printed circuit board includes a second connecting terminal for connecting to the flexible printed circuit board from the radial direction.

2. The optical disc apparatus according to claim 1,
wherein the flexible printed circuit board has an indentation approximately in the middle, and is twisted at the indentation.

3. The optical disc apparatus according to claim 1,
wherein the pickup assembly has a positioning member located in proximity to the connecting terminals of either one of the first and second printed circuit boards, and wherein the flexible printed circuit board has a recess of such shape that the positioning member, engages therewith.

* * * * *